(12) United States Patent
Berkcan et al.

(10) Patent No.: US 7,667,375 B2
(45) Date of Patent: Feb. 23, 2010

(54) BROAD BAND ENERGY HARVESTING SYSTEM AND RELATED METHODS

(75) Inventors: Ertugrul Berkcan, Clifton Park, NY (US); Robert John Wojnarowski, Ballston Lake, NY (US); Emad Andarawis Andarawis, Ballston Lake, NY (US); Samantha Rao, Bangalore (IN); Eladio Delgado, Burnt Hills, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 548 days.

(21) Appl. No.: 11/398,840

(22) Filed: Apr. 6, 2006

(65) Prior Publication Data

US 2009/0167110 A1 Jul. 2, 2009

(51) Int. Cl.
*H01L 41/08* (2006.01)
*H01L 41/083* (2006.01)

(52) U.S. Cl. ........................ 310/339; 310/330

(58) Field of Classification Search ......... 310/330–332, 310/339
See application file for complete search history.

(56) References Cited

U.S. PATENT DOCUMENTS

| | | | | |
|---|---|---|---|---|
| 5,814,921 | A * | 9/1998 | Carroll | 310/339 |
| 6,771,007 | B2 | 8/2004 | Tanielian | |
| 6,858,970 | B2 | 2/2005 | Malkin et al. | |
| 7,409,851 | B2 * | 8/2008 | Ilic et al. | 73/24.06 |
| 2004/0075363 | A1 * | 4/2004 | Malkin et al. | 310/321 |
| 2006/0219010 | A1 * | 10/2006 | Ilic et al. | 73/590 |
| 2007/0125176 | A1 * | 6/2007 | Liu | 73/649 |
| 2008/0136562 | A1 * | 6/2008 | Kulah et al. | 333/186 |
| 2008/0205479 | A1 * | 8/2008 | Tao et al. | 374/117 |

FOREIGN PATENT DOCUMENTS

WO        WO 0120760 A1 *   3/2001

OTHER PUBLICATIONS

Wilfinger et al. Speech Codes Utilizing Semiconductor Cantilevers, IBM Technical Disclosure Bulletin, vol. 10 No. 8 Jan. 1968, p. 1259.*
Zhang et al., Multi-Mode piezoelectric energy harvesters for wireless sensor network based structural health monitoring Nondestructive Characterization for Composite Materials, Aerospace Engineering, Civil Infrastructure and Homeland Security 2008, Conference Date Mar. 3, 2008 (Publication Date Jun. 17, 2008).*

* cited by examiner

*Primary Examiner*—Jaydi SanMartin
(74) *Attorney, Agent, or Firm*—Bracewell & Giuliani LLP

(57) ABSTRACT

A broad band energy harvesting system to harvest energy from a structure and associated methods are provided. The system includes a structure carrying a plurality of environmentally produced vibration frequencies extending over a frequency range and an energy harvesting apparatus positioned in vibration receiving communication with the structure to harvest energy from the structure. Each energy harvesting apparatus includes broadly tuned energy harvesting generators having relatively low quality factor and corresponding relatively wide bandwidth. The energy harvesting generators collectively provide energy harvesting over multiple modes to thereby provide energy harvesting over a substantial portion of the frequency range. Each energy harvesting generator can include a cantilevered beam connected to a common backbone comprised of a resilient material configured to transfer energy between adjacent generators to further enhance energy harvesting.

18 Claims, 7 Drawing Sheets

BROAD BAND ENERGY HARVESTING SYSTEM AND RELATED METHODS

BACKGROUND OF THE INVENTION

1. Field of the Invention

The present invention relates generally to energy harvesting systems. More specifically, the present invention relates to a broad band energy harvesting system and related methods to harvest energy from the structure.

2. Description of the Related Art

Various types of platforms such as, for example, aircraft structural components, aircraft skins, or other related components, when in operation are subjected to various environmental conditions such as stress and strain, exposure to temperature extremes, and significant vibration energy. Due to the various environmental conditions such components can suffer material degradation over time.

Structural health monitoring helps promote realization of the full potential of such components. Remotely positioned sensors and/or nodes have been installed adjacent to such structures/components to monitor various parameters such as, for example, strain levels, stress, temperature, pressure, or vibration level to help manage physical inspection schedules, maintenance schedules, to help predict material failure, and generally monitor the "health" of such components.

Such sensors have been provided a dedicated power supply such as power obtained through conductors, e.g., wires, connected to the aircraft electrical system or through chemical batteries. Such wiring can, in some instances, undesirably result in increased weight and complexity of the component being monitored and/or the associated structure or component and are subject to damage or breakage requiring extensive repair costs and down time.

Depending upon available space, batteries can be inappropriate due to their size. Batteries can also have a limited service life and therefore, typically require periodic inspection and/or replacement, are often positioned in locations difficult to reach, and often require costly disassembly and reassembly of the sensor or component to perform service on the battery. Further, batteries may not be suitable due to environmental constraints, i.e., temperature changes often affect battery performance.

Other structural health monitoring systems include self-powered sensors attached to or embedded within the components to be monitored that can reduce dependence on batteries or any other external power source. The sensors can include an energy harvesting device either incorporated within the sensor or connected externally. Such sensors can be relatively small in size and can utilize, as a power source, energy obtained or otherwise transmitted through the component or structure being monitored. This type of sensor can typically consume very low amounts of power in the microwatt range.

The energy harvesting devices for these sensors can generate small electrical currents, for example, when the material is deflected, such as when the monitored component vibrates. To do so, such devices typically include one or more cantilevered beams weighted with a proof mass on the free end and connected to a base on the opposite end, which is connected to or in direct contact with the vibrating structure. Each cantilevered beam can form a resonator or generator. Resonators and resonant systems have a natural frequency. Such resonators and resonant systems respond to frequencies close to their natural frequency much more intensely than to other frequencies. Each beam is sized and/or weighted to vibrate at a preselected resonant frequency coinciding with the expected frequency of the vibration energy generated by the structure. Such devices are designed with a relatively high quality factor and corresponding narrow bandwidth in order to maximize harvesting energy from the structure at the expected vibration frequency. This quality factor is a measure of the "quality" of the resonator, which in a mechanical system indicates, the effect of mechanical resistance to resonance—a high-quality factor equates to low mechanical resistance.

Each beam also generally has a material attached which generates electrical currents when the beam, and thus the material, is deflected by the vibrations. Piezoelectric material is but one example of materials that perform this function. As each beam deflects at the preselected resonant frequency due to the vibrations generated by the structure, the piezoelectric material converts a fraction of the mechanical energy to electrical energy. An electric circuit including a storage device, such as a capacitor, is typically connected to the piezoelectric electric material to receive and store the generated electricity for use by the sensor or node.

Where the vibration energy is expected at more than one discrete frequency, multiple energy harvesting devices can be deployed with each tuned to resonate at a separate preselected discrete resonant frequency coinciding with each of the discrete vibration frequencies expected to be generated by the structure. In another design, each of the beams or group of beams in a single energy harvesting device can be separately sized and/or weighted to vibrate at a separate preselected discrete resonant frequency coinciding with each of the discrete vibration frequencies expected to be generated by the structure. As with the single resonant frequency-multiple resonator design described above, this multiple resonant frequency-multiple resonator design is configured so that each of the beams (resonators) are designed with a relatively high quality factor and correspondingly narrow bandwidth in order to maximize harvesting energy from the structure at the expected predetermined vibration frequencies.

Because power harvesting relies on energy being available in the vicinity of the energy harvesting device, the sensors positioned in the areas of environmental energy having a frequency different than the expected frequency often do not receive sufficient power to provide continuous sensing capability necessary to perform even sampled sensing using a small duty cycle. Also, the available energy distribution may change such that an area of the structure once having a high level of environmental energy at an expected frequency or frequencies is now subject only to a low-level of such energy at such frequency or frequencies, making power availability less reliable. In such situations, energy may nevertheless be available at one or multiple frequencies spaced over and/or shifting over different frequencies between a known frequency band. Further, an operator installing the energy harvesting device may not know anything more than a range of potential frequencies that the energy harvesting device will have access to until immediately prior to actually installing the device in or on the vibrating structure, i.e., selecting the location on the structure to position the energy harvesting device. As such, each individual energy harvesting device may need to be manually tuned according to its selected location, or groups of devices having different predetermined resonant frequencies may need to be manufactured separately for different portions of a structure expected to experience different but known vibration frequencies.

Recognized by the Applicants is that energy harvesting devices having one or more discrete resonant frequencies configured to have a relatively high quality factor, and thus, a correspondingly relatively low bandwidth, may be unreliable in the expected frequency or frequencies of the environmentally generated vibration energy of the structure if the expected frequency or frequencies of the vibration energy do not fairly precisely match the actual frequency or frequencies of the environmentally generated vibration energy. Correspondingly, also recognized by the Applicants is the need for a broad band energy harvesting system capable of harvesting energy over a relatively broad frequency band so that as the frequency of the environmentally generated energy shifts, the broad band energy harvesting system can continue harvesting energy, and thus, supply power to the associated sensor or sensors. Further recognized by the Applicants is the need for a single energy harvesting device or apparatus capable of working over a very broad range of frequencies that would be available in different locations on a structure.

SUMMARY OF THE INVENTION

In view of the foregoing, embodiments of the present invention advantageously provide a broad band energy harvesting system that reduces dependence on batteries or any other external power source. Embodiments of the present invention advantageously provide an energy harvesting system capable of generating or harvesting energy from a structure having environmental energy distributed over a wide frequency band. Embodiments of the present invention advantageously can also provide a single energy harvesting apparatus capable of working over a very broad range of frequencies, groups of which would be available in different locations on a structure. Embodiments of the present invention advantageously can additionally provide an energy harvesting apparatus capable of providing energy harvesting over multiple frequencies, simultaneously, within the wide frequency band.

More specifically, in an embodiment of the present invention, a broad band energy harvesting system includes a structure such as, for example, an aircraft having a body or portion thereof, e.g., leading-edge, a joint, or the skin of an aircraft wing. The structure can carry or otherwise conduct a plurality of environmentally produced vibration frequencies extending over a broad frequency range, which are generated by environmental factors interacting with the body of the structure. The system can also include a plurality of broadly tuned energy harvesting generators (resonators) each having a resonant frequency and configured to have a relatively low quality factor and corresponding relatively wide bandwidth covering a portion of the broad frequency range.

Advantageously, the low quality factor and wide bandwidth allow each respective generator of the energy harvesting apparatus, in response to environmental energy emanating from the structure, to harvest a predefined minimum amount of energy from or at each of a plurality of discrete vibration frequencies adjacent the resonant frequency defining or otherwise falling within the bandwidth. That is, if energy or power is available from the structure at an associated minimum energy at one or more discrete vibration frequencies falling within the bandwidth of the respective generator, the energy harvesting apparatus can generate sufficient electric power to power an associated power consuming device such as, for example, a health monitoring sensor node. In order to configure each generator to have a low quality factor, each generator can include or interface with a damper or other resistive means positioned to dampen or otherwise reduce the magnitude of the isolations of the respective generator.

Further advantageously, each of the plurality of energy harvesting generators of each energy harvesting apparatus collectively provide energy harvesting over the plurality of modes to thereby provide energy harvesting over a substantial portion of the broad frequency range. That is, according to an embodiment of the present invention, a maximum frequency for a first generator bandwidth of a first one of the plurality of generators can overlap a minimum frequency for a second generator bandwidth of a second one of the plurality of generators, and so on, to thereby provide energy harvesting capability at the predefined minimum amount of energy over a substantial portion of the frequency range.

According to an embodiment of the present invention, the energy harvesting apparatus includes a plurality of cantilevered beams each carrying a piezoelectric material to form a respective one of the plurality of generators. Each cantilevered beam is preferably fixedly connected to a common backbone. The common backbone includes a resilient material configured to allow the transfer of energy between adjacent generators to thereby enhance energy harvesting.

Embodiments of the present invention can also include methods of harvesting energy from a structure. For example, according to an embodiment of the present invention, a method of harvesting energy from a structure can include providing an energy harvesting apparatus including a plurality of energy harvesting generators each connected to a non-fixed portion of a resilient common backbone and each adapted to oscillate at separate and distinct modes responsive to multifrequency environmental energy received from the structure. Also, in order to further enhance energy harvesting or increase in the number of discrete frequencies potentially providing a minimum amount of energy or power/power density needed by an associated power consuming device, the method can include the steps of damping the oscillations of at least one but preferably each of the generators to simultaneously reduce the quality factor and widen the bandwidth of the generator to thereby provide energy harvesting capability at a predefined minimum amount of energy over a substantial portion of a relatively broad frequency range.

According to an embodiment of the present convention, the method can also include the step of selecting separate and distinct modes for each of the generators to collectively maximize the number of discrete frequencies within the broad frequency range capable of providing a predefined minimum energy. That is, the modes can be selected to increase the number of discrete vibration frequencies to enhance receiving energy or power that, when harvested, is sufficient to meet the needs of the associated power consuming device. Further, the method can also include the step of carrying part of the energy from one of the generators to an adjacent generator through the resilient backbone to thereby increase total energy harvested by each of the plurality of generators.

BRIEF DESCRIPTION OF THE DRAWINGS

So that the manner in which the features and advantages of the invention, as well as others which will become apparent, may be understood in more detail, a more particular description of the invention briefly summarized above may be had by reference to the embodiments thereof which are illustrated in the appended drawings, which form a part of this specification. It is to be noted, however, that the drawings illustrate only various embodiments of the invention and are therefore not to be considered limiting of the invention's scope as it may include other effective embodiments as well.

DETAILED DESCRIPTION

The present invention will now be described more fully hereinafter with reference to the accompanying drawings, which illustrate embodiments of the invention. This invention may, however, be embodied in many different forms and should not be construed as limited to the illustrated embodiments set forth herein. Rather, these embodiments are provided so that this disclosure will be thorough and complete, and will fully convey the scope of the invention to those skilled in the art. Like numbers refer to like elements throughout. Prime notation, if used, indicates similar elements in alternative embodiments.

The various systems such as, for example, multi-node health monitoring sensor systems require power to perform their associated function. In wireless structural health monitoring applications, for example, where batteries are not appropriate due to their size, longevity, or environmental constraints, or when it is desired to supplement batteries with alternate energy sources to achieve long operating life, power or energy harvesting techniques are employed. Because energy harvesting relies on environmentally generated energy being available, energy harvesting devices or apparatus can be restricted or constrained to harvest energy according to predetermined parameters. Further, environmental energy distribution may change making energy harvesting less reliable than other forms of energy. Thus, as illustrated in FIGS. 1-10, embodiments of the present invention provide a broad band energy harvesting system, broad band energy harvesting apparatus, and methods of harvesting energy from a structure carrying environmentally induced energy.

Figure 1:
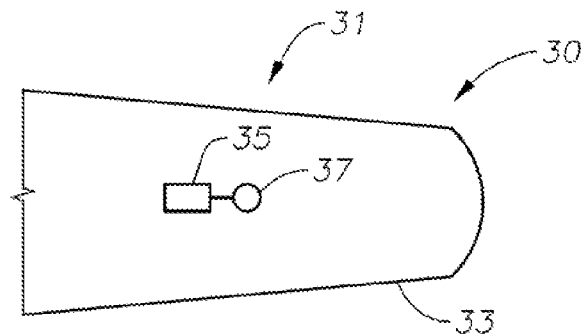
FIG. 1 is a schematic diagram of a general system architecture of a broad band energy harvesting system according to an embodiment of the present invention.

As perhaps best shown in FIG. 1, a broad band energy harvesting system 30 includes a structure 31 having a body 33 carrying environmentally produced energy, e.g., in the form of vibrations having one or more discrete frequencies distributed over a broad frequency range or band. Examples of such body 33 can include the leading-edge, a joint, or the skin of an aircraft wing, an aircraft fuselage, various structural parts of other vehicles subject to environmental forces, and the support beams of stationery structures such as bridges, just to name a few. The system 30 also includes a plurality of energy harvesting apparatus 35 positioned either within (FIG. 2) or external to (FIG. 3) a power consuming device 37 such as, for example, a health monitoring sensor node positioned to monitor the health of the structure 31. Each energy harvesting apparatus 35, regardless of its relationship with the power consuming device 37, is positioned in vibration receiving communication with the body 33 structure 31.

Figure 2:
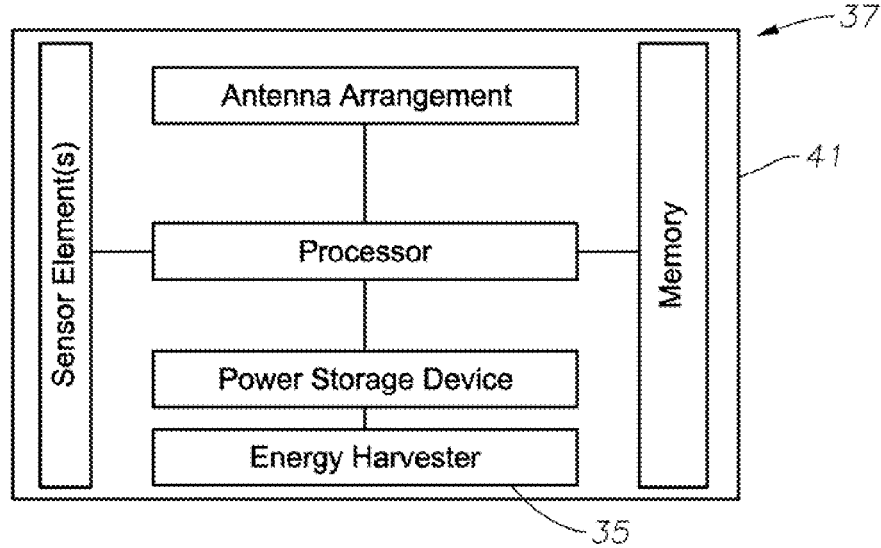
FIG. 2 is a schematic diagram of a health monitoring sensor node having an energy harvesting apparatus housed therein according to an embodiment of the present invention.
Figure 3:
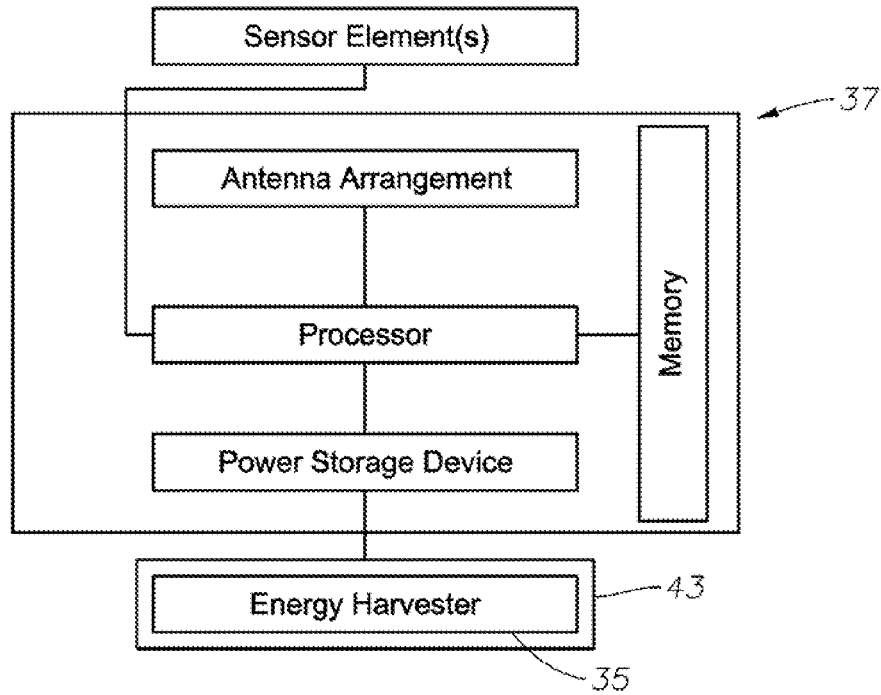
FIG. 3 is a schematic diagram of a health monitoring sensor node connected to an externally positioned energy harvesting apparatus according to an embodiment of the present invention.
Figure 4:
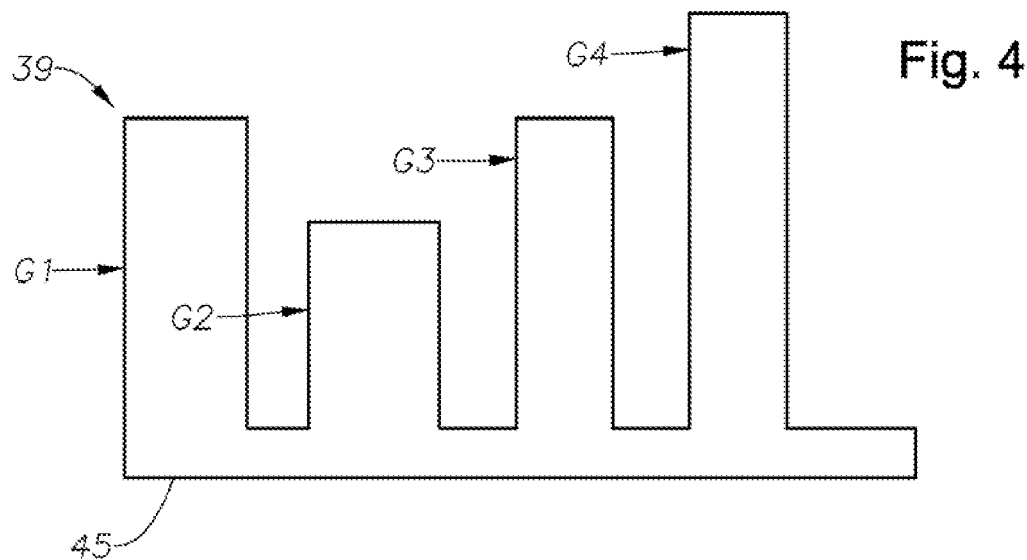
FIG. 4 is a schematic diagram of a plurality of generators connected to a common backbone according to an embodiment of the present invention.

As shown in FIGS. 2-4, each energy harvesting apparatus 35 includes at least one but preferably a plurality of broadly tuned energy harvesting resonators or generators 39 (FIG. 4) positioned within, for example, the housing 41 (FIG. 2) of the power consuming device 37 or a separate housing 43 (FIG. 3) adapted to connect to a portion of the body 33 of the structure 31. According to an embodiment of the present invention, the generators 39 are each connected to a base beam formed of a resilient material such as, for example, brass, silicon, or aluminum defining a resilient common backbone 45. FIG. 4 illustrates four generators 39 indicated as $G_1$, $G_2$, $G_3$, $G_4$ connected to a resilient common backbone 45. In applications where the common backbone 45 is relatively large, the backbone 45 is preferably composed of brass or a brass alloy according to a preferred configuration. Where the backbone 45 is relatively small, such as when placed in or configured to form part of a microelectromechanical system (MEMS), the backbone 45 is preferably composed of silicon. Note, although brass, silicon, and aluminum are preferred materials, other materials which are resilient or can be made resilient are within the scope of the present invention.

A portion of the common backbone 45 can be fixedly connected to the housing 41, 43, using means known and understood by those skilled in the art, so that a non-fixed portion extends therefrom. Regardless of the configuration, the common backbone 45 is preferably connected so that it is not substantially fixed in space, i.e., a relatively narrow percentage of the backbone 45 is connected to the housing 41, 43, at either a medial portion or at one of its ends in order to minimize damping of any vibrations being translated between individual generators 39. In alternative embodiments of the present invention, the backbone 45 can be connected directly to the body 33 of the structure without use of a housing 41, 43, as described above. In either embodiment, the resilient common backbone 45 can form at least a portion of a resonator to further enhance energy transfer between adjacent generators 39.

Figure 5:
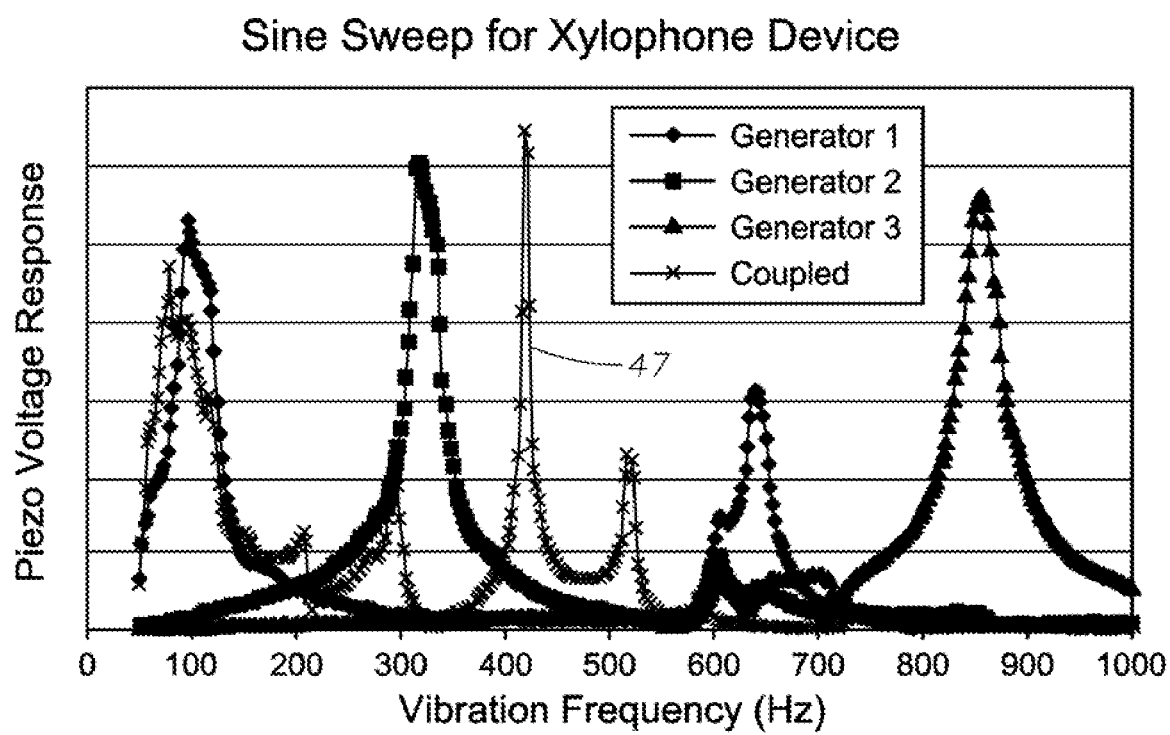
FIG. 5 is schematic of a spectral plot of a voltage frequency response for three generators along with a coupled response resulting from use of a resilient common backbone according to an embodiment of the present invention.

As shown in FIG. 5, the resilient common backbone 45 can be configured to transfer or to allow the transfer of energy between adjacent energy harvesting generators 39 which may oscillate more efficiently at a different mode, thereby enhancing energy harvesting. FIG. 5 shows a voltage response for a three beam/generator arrangement, illustrating the edition of a coupled response 47 resulting from energy transfer between the three generators 39. In operation, as each of the generators 39 begin resonating, the resilient common backbone 45 begins to bend and twist adding an order of different modes to the excitation of the cantilevers 49 forming the generators 39, generating voltage at frequencies not necessarily coinciding with the vibration frequencies emanating from the structure 31 or capable of being generated if a rigid common backbone were used.

Figure 6:
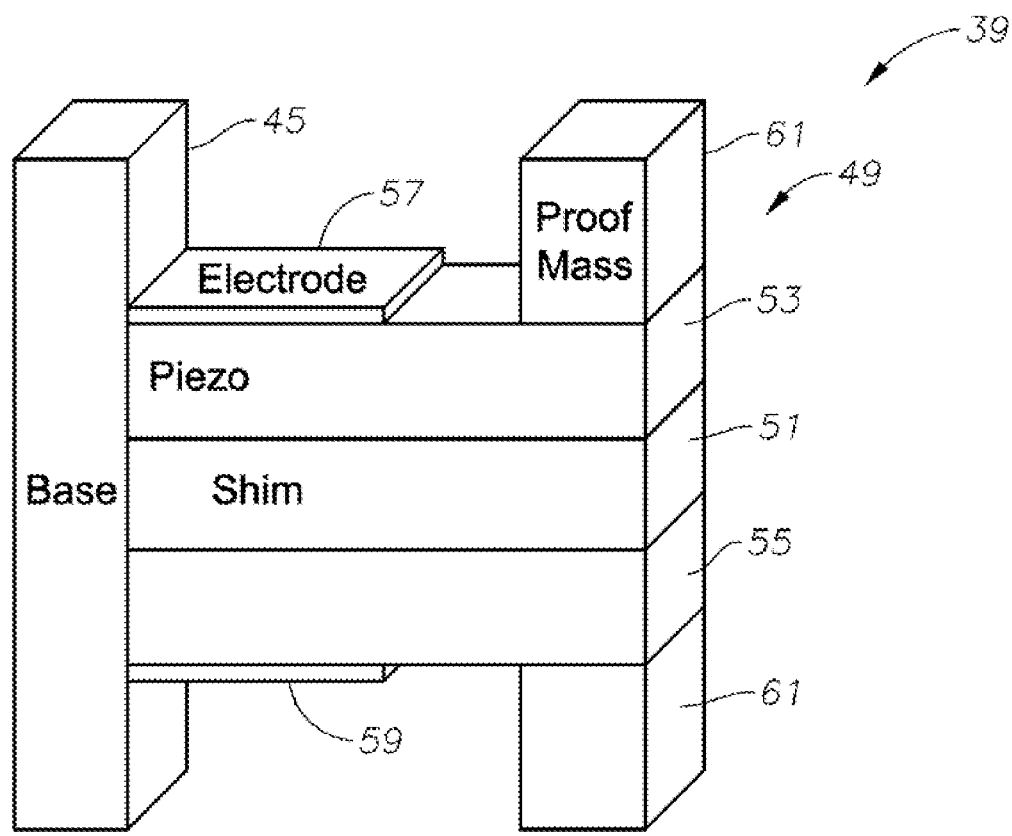
FIG. 6 is a schematic diagram of a generator connected to a base backbone according to an embodiment of the present invention.
Figure 7:
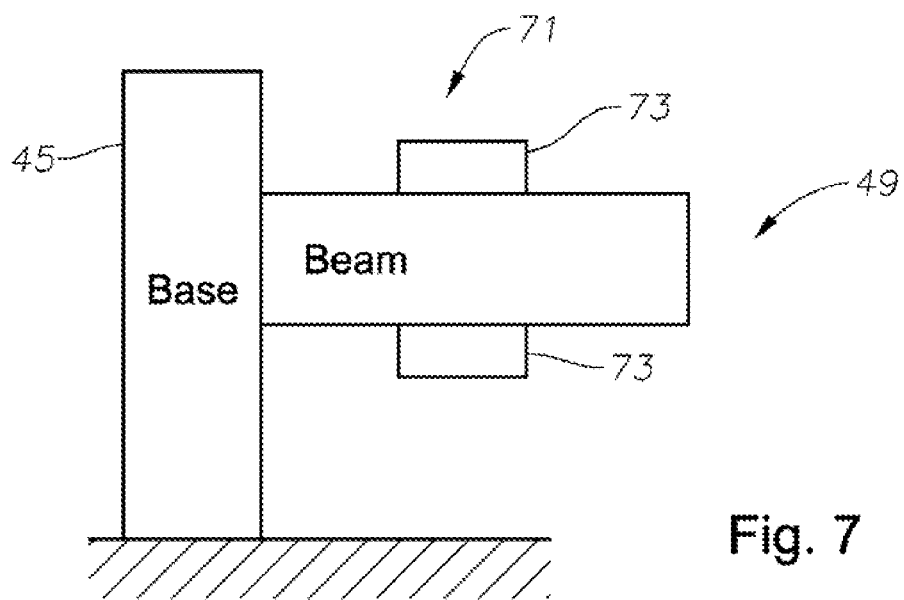
FIG. 7 is a schematic diagram of the generator illustrated in FIG. 6 modified with a damper according to an embodiment of the present invention.

As shown in FIGS. 6-7, according to an embodiment of the present invention, each generator 39 can include one or more cantilevered beams 49 each connected to the non-fixed portion of the resilient common backbone 45. Each cantilevered beam 49, according to the preferred configuration, includes an elongated shim 51 having any proximal end connected to the backbone 45 and a free distal end extending therefrom. The shim 51, preferably made of a conductive material such as, for example, brass, is interfaced with or otherwise in contact with a piezoelectric material 53, 55, such as, for example, lead zirconium titanate (PZT) to generate electricity. An electrode 57, 59, for example, made of nickel or other conductive material, is connected to or otherwise in contact with the piezoelectric material 53, 55, generally at a point of maximum strain in order to collect electrons generated by movement of the shim 51 and piezoelectric material 53, 55. A proof mass 61 or pair of proof masses 61 are positioned at the free distal end of the cantilevered beam 49. The proof mass or masses 61, generally configured so that the mass of the cantilevered beams 49 approximate that of the proof masses 61, can be used to set or refine the resonant frequency for each generator 39.

In the illustrated configuration, a circuit is formed between the shim 51, piezoelectric material 53, and the first electrode 57. A circuit of opposite polarity is formed between the shim 51, piezoelectric material 55, and the first electrode 59. This configuration, termed a bimorph, allows vibrations originating in the structure 31 to be transferred to the cantilevered beams 49 which resonate, for example, about different preselected frequencies, to provide a fairly steady stream of electricity both during a forward stroke and an aft stroke of the cantilevered beam 49. Note, one or more of the cantilevered beams 49 can be connected to the resilient backbone 45 at a medial portion of the beam 49 rather than a proximal portion, as illustrated, however, in such configuration, the cantilevered beam 49 would generally be considered to be a pair of cantilevered beams 49 each connected at a proximal end forming a corresponding pair of resonators or generators 39.

Figure 8:
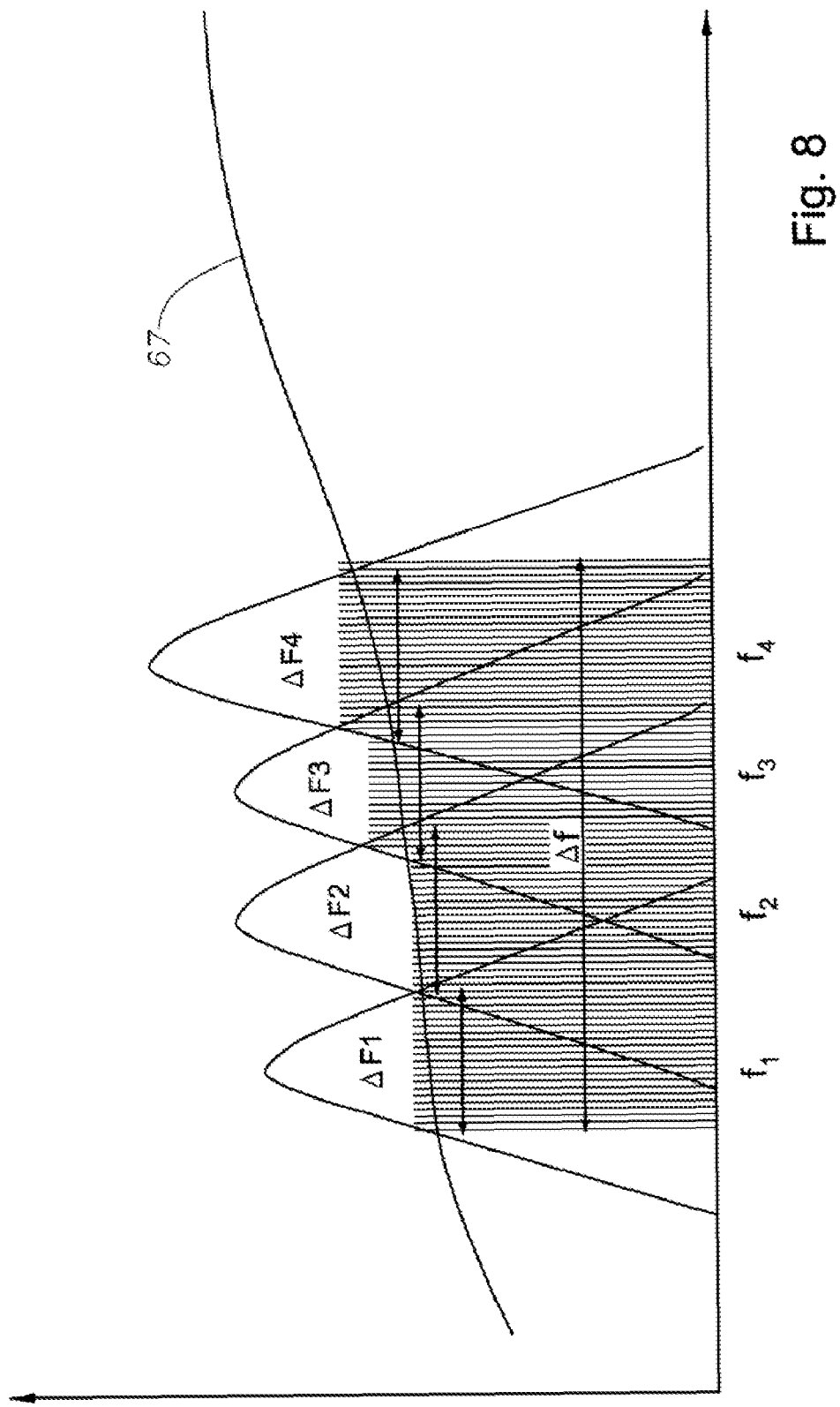
FIG. 8 is a schematic of a combination spectral plot and energy-power consumption plot illustrating bandwidth coverage of four generators according to an embodiment of the present invention.

As perhaps best shown in FIGS. 6 and 8, each energy harvesting generator 39 is configured with a preselected resonant frequency, e.g., $f_1, f_2, f_3, f_4$, corresponding to the generators $G_1, G_2, G_3, G_4$, respectively, illustrated in FIG. 4. Each defines a mode and functions to resonate at each of a plurality of frequencies adjacent the respective preselected resonant frequency $f_1, f_2, f_3, f_4$, defining a generator bandwidth $\Delta f_1, \Delta f_2, \Delta f_3, \Delta f_4$. The resonant frequency of each of the generators, collectively referred to as generators 39, is a function of the geometry of the cantilevered beam 49 and the material composition of the shim 51 and/or piezoelectric material 53, 55, directly related to the stiffness of the cantilevered beam 49, and the mass of the cantilevered beam 49 which is typically controlled through use of the proof mass 61. As such, as known to those skilled in the art, the resonant frequency is equal to a constant times the square root of the stiffness of the cantilevered beam 49 divided by the mass of the beam 49.

As each cantilevered beam 49 is deflected due to the vibrations, the piezoelectric material 53, 55 converts the mechanical energy into electrical energy. The generators collectively provide energy harvesting over each respective generator bandwidth $\Delta f_1, \Delta f_2, \Delta f_3, \Delta f_4$ of the plurality of modes, to thereby provide energy harvesting capability over the broad frequency range $\Delta f$ sufficient to power the power consuming device 37.

As perhaps best shown in FIG. 8, according to an embodiment of the present invention configured with or without the common resilient backbone 45, each generator 39 can be configured to have a relatively low quality factor and corresponding relatively wide bandwidth. That is, according to the preferred configuration, the energy harvesting generators 49 of each energy harvesting apparatus 39 can collectively provide energy harvesting over the multiple modes, e.g., having bandwidths $\Delta f_1, \Delta f_2, \Delta f_3, \Delta f_4$, respectively, to thereby provide energy harvesting over the broad frequency range $\Delta f$ or at least a substantial portion thereof. This can be a vast improvement over prior single- or multi-beam configurations having a high quality factor and relatively narrow bandwidth such as, for example, those illustrated in FIGS. 9 and 10, as it allows the energy harvesting apparatus 35 to function more versatility, providing energy harvesting capability to different portions of the structure 31 having environmental energy in the form of vibrations of different or variable/shifting frequencies.

Figure 9:
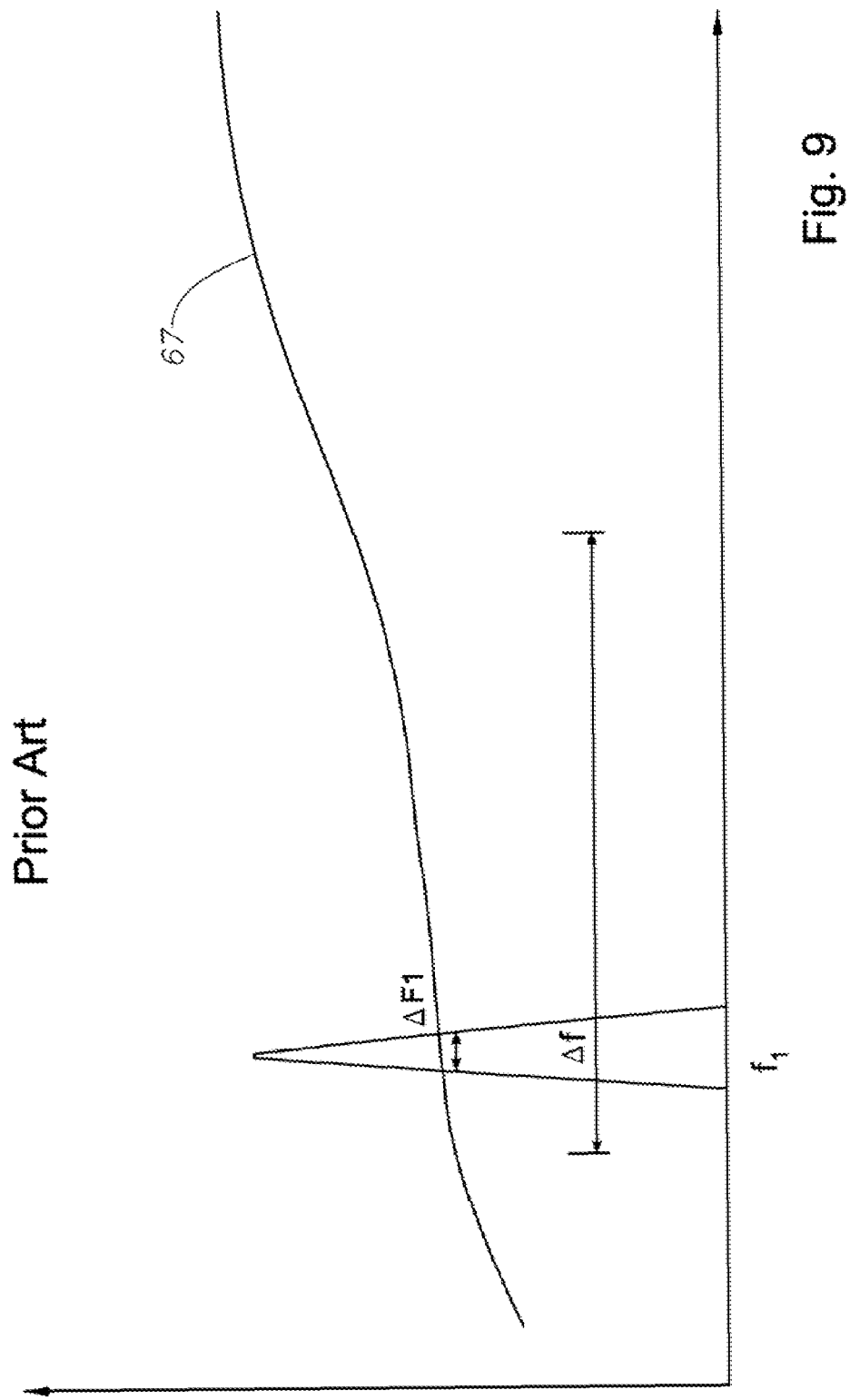
FIG. 9 is a schematic of a combination spectral plot and energy-power consumption plot illustrating bandwidth coverage of a single prior art generator.
Figure 10:
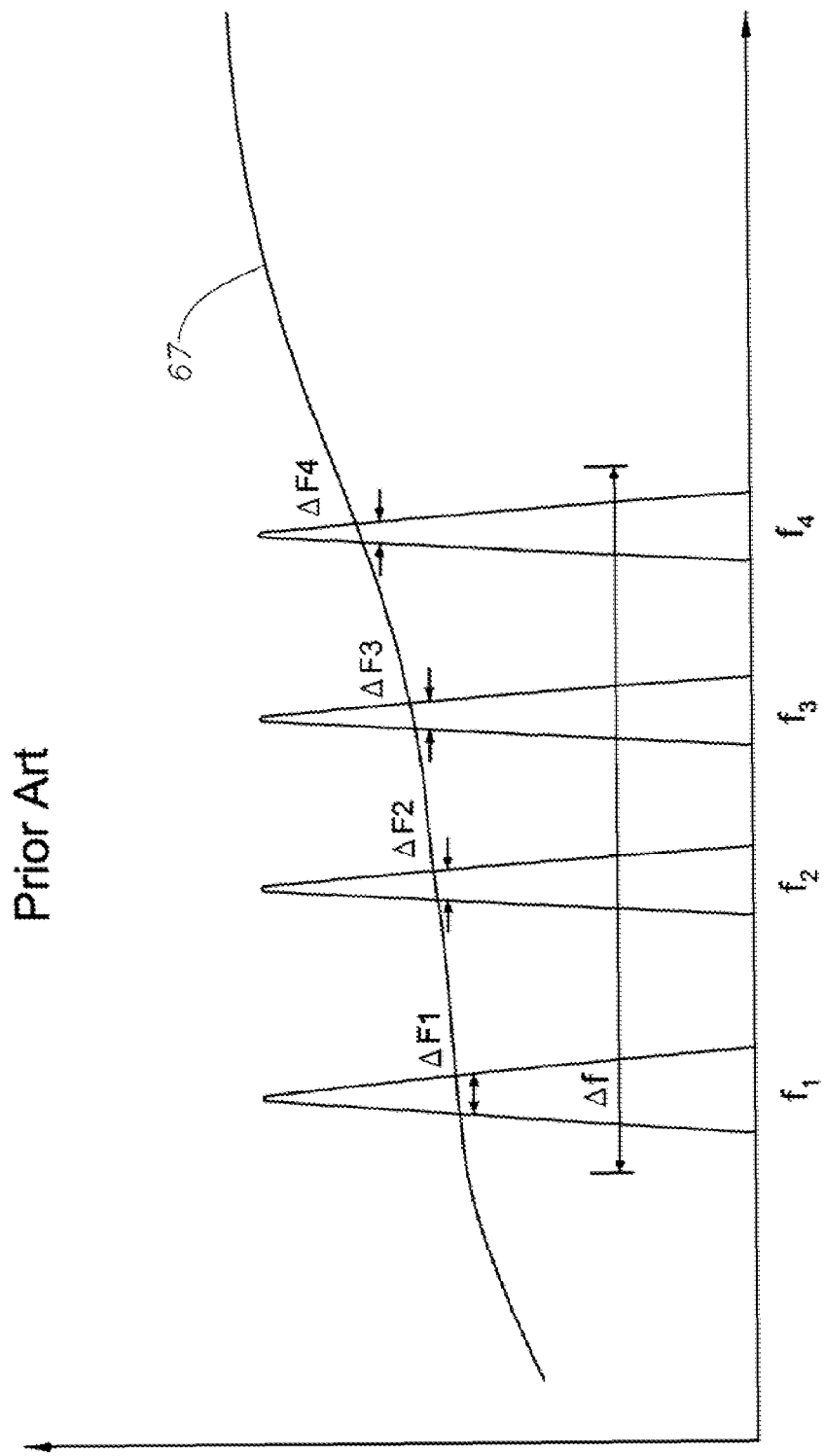
FIG. 10 is a schematic of a combination spectral plot and energy-power consumption plot illustrating bandwidth coverage of four prior art generators.
Figure 11:
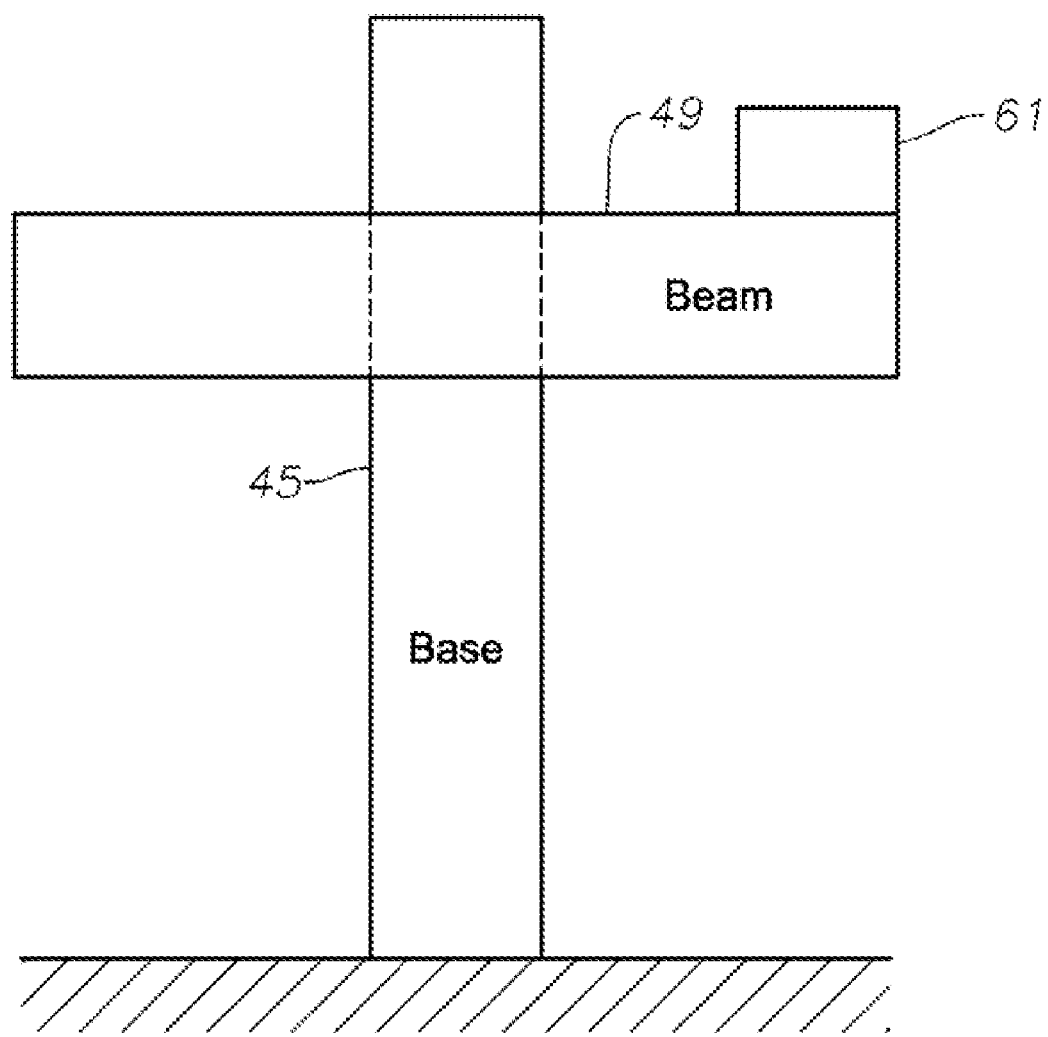
FIG. 11 is a schematic diagram of a generator connected to a base backbone at a medial portion according to an embodiment of the present invention.

The vertical axis of the spectral plot in FIGS. 8-10 indicates either energy, power, or power density. Correspondingly, the line 67 illustrated in the figures represent the energy level, power level, or power density from a vibration source having a discrete vibration frequency to supply sufficient power, for example, required by the preselected power consuming device 37 to sustain operations. As illustrated, by configuring each generator 39 to have a relatively low quality factor, the bandwidth can be correspondingly broadened to enhance the number or quantity of vibration frequencies potentially emanating from the structure 31 which can provide sufficient energy, power, or power density to power the power consuming device 37. According to an embodiment of the present invention, the combination of the resonant frequencies, e.g., $f_1, f_2, f_3, f_4$, in the four generator example and the individual quality factors resulting in bandwidths $\Delta f_1, \Delta f_2, \Delta f_3, \Delta f_4$, can be selected to maximize the number of discrete frequencies within the broad frequency band $\Delta f$ capable of supplying sufficient energy, power, or power density. That is, the maximum frequency for the first resonator bandwidth $\Delta f_1$, can be substantially adjacent or overlap the minimum frequency for the second resonator bandwidth $\Delta f_2$, the maximum frequency for the second resonator bandwidth $\Delta f_2$ can be substantially adjacent or overlap the minimum frequency for the third resonator bandwidth $\Delta f_3$, and the maximum frequency for the third resonator bandwidth $\Delta f_3$ can be substantially adjacent overlap the minimum frequency of the fourth resonator bandwidth $\Delta f_4$.

The quality factor for a mechanical system is generally defined as a function of the resonant frequency divided by the frequency differential between the pair of frequencies identified along the frequency spectrum for each mode for the value of the associated spectral plot at half the maximum amplitude of the amplitude at the peak or resonant frequency, termed full width at half maximum. Prior energy harvesting systems tend to maximize performance of the sake of bandwidth, configuring their resonators to have a high quality factor of typically between 50 to 100 each centered about a preselected resonant frequency (see FIG. 9) or multiple preselected resonant frequency bands (see FIG. 10) expected to be emanating from the energy providing structure. According to the preferred embodiment of the present invention, the generators 39 are intentionally detuned to provide a low quality factor of less than 50, and more preferably less than approximately 10.

As perhaps best shown in FIG. 6, each generator 39 can include a damper 71 or other form of resistive means known to those skilled in the art and positioned to reduce the magnitude of the oscillations of each of the generators 39 to thereby produce the relatively low quality factor and relatively wide resonator bandwidth. For example, the damper 71 can include projections or ribs 73 extending from the shim 51, a fluid material (not shown) surrounding the cantilevered beam 49, a spring or piston (not shown) connected to the cantilevered beam 49, a combination friction pad (not shown) connected to a portion of the cantilevered beam 49 and a receiving surface connected to or part of the housing 41, 43, or structure 31, or any other means that inversely varies its effect with the time rate of change of displacement or velocity of the cantilevered beam 49. The lossy terms provided by the damper 71 can allow more efficient conversion of energy and electricity.

Embodiments of the present invention also include methods of harvesting energy from a structure. For example, according to an embodiment of the present invention, a method of harvesting energy from a structure 31 can include providing an energy harvesting apparatus 35 including a plurality of energy harvesting resonators defining generators 39 each connected to a non-fixed portion of a resilient common backbone 45 (FIG. 4) and each adapted to oscillate at separate and distinct modes (FIG. 8) responsive to multifrequency environmental energy received from the structure 31. The method can also include the step of carrying part of the energy from one of the generators 39 to an adjacent generator 39 through the resilient backbone 45 to thereby increase total energy harvested by each of the plurality of generators 39 (see FIG. 5).

The method can also include the step of selecting separate and distinct modes for each of the generators 39 to collectively maximize the number of discrete frequencies within a broad frequency range $\Delta f$ capable of providing a predefined minimum energy 67 (see FIG. 8). That is, the modes can be selected to increase the number of discrete vibration frequencies to enhance receiving energy or power that, when harvested, is sufficient to meet the needs of the power consuming device 37. Also, in order to further enhance energy harvesting or increase in the number of discrete frequencies potentially providing a minimum amount of energy or power/power density needed by the power consuming device 37, the method can include damping the oscillations of at least one but preferably each of the generators 39 to simultaneously reduce the quality factor, for example, to at least below 50, but preferably below 10, and correspondingly widen the bandwidth of the generator 39 to thereby provide energy harvesting capability at a predefined minimum amount of energy over a substantial portion of the broad frequency range $\Delta f$.

The invention has several advantages. Embodiments of the present invention provide a sequence of resonators/generators each covering a portion of a frequency range used to cover a broad frequency range. Advantageously, each one of these generators can be designed to resonate at a separate frequency within the wide frequency band and with an intentionally low quality factor, enhancing the overall energy output of the energy harvesting apparatus over that which could be achieved with a conventional resonator especially where the environmental vibration energy is at a frequency different than the generator resonant frequency. Advantageously, these generators can be connected in tandem to provide necessary power over the complete broad frequency range. As such, the operation of this apparatus can be compared to that of a xylophone, with each one of the generators corresponding to a broadly tuned resonant member of the xylophone.

Advantageously, according to an embodiment of the present invention, the generators are obtained using a cantilevered beam, fixed at one end, and covered with a piezoelectric material. Such cantilevered beams can be connected to a resilient backbone which can allow energy from one beam to be transmitted to another beam which can more efficiently utilize such energy thereby enhancing the overall energy output of the energy harvesting apparatus over that which could be achieved otherwise. These cantilevers can also be coated with piezoelectric material such as lead zirconium titanate (PZT) to obtain a voltage that is proportional to the strain on the cantilever. Appropriate and differing proof masses can be used at the end of these cantilevers to better further tune the individual structures. The piezoelectric material can further be used on opposite sides of the cantilever to obtain a bimorph, further doubling the voltage or the power that can be harvested.

Advantageously, the broad band energy harvesting system can be part of a broader health monitoring system such as that described in, for example, U.S. patent application Ser. No. 11/286,792 by Andarawis et al., titled "System to Monitor the Health of Structural Components, Sensor Nodes, Program Product, and Related Methods" filed Nov. 23, 2005, incorporated herein by reference in its entirety, which can include a plurality of health monitoring sensor nodes each connected to or embedded within the body of the structure to monitor data related to parameters of a portion of the body of the structure, which can be supplied powered primarily by the broad band energy harvesting apparatus.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification. For example, various other beam material, beam geometric configuration, and electrical circuit designs known to those skilled in the art can be utilized to harvest and/or store energy obtained from the environment and are within the scope of the present invention. Also for example, the illustrated embodiments included multiple generators. Energy harvesting apparatus having a single generator tuned to have a relatively low quality factor is within the scope of the present invention.

That claimed is:

1. An energy harvesting apparatus configured to be positioned in vibration receiving communication with a structure, the energy harvesting apparatus comprising:

a housing adapted to connect to a structure carrying a plurality of environmentally produced vibration frequencies distributed over a frequency range;

a base beam formed of a resilient material defining a resilient common backbone having a proximal fixed portion fixedly connected to the housing, a non-fixed distal portion, and a non-fixed medial portion extending therebetween to thereby form a cantilever; and a plurality of cantilevered beams each fixedly connected to a non-fixed portion of the resilient common backbone and defining a corresponding plurality of energy harvesting generators, each energy harvesting generator having a preselected different resonant frequency defining a mode and configured to resonate at each of a plurality of frequencies adjacent the respective preselected resonant frequency defining a generator bandwidth, the plurality of generators collectively configured to provide energy harvesting over each of the plurality of generator bandwidths to thereby enhance energy harvesting.

2. The energy harvesting apparatus as defined in claim 1, wherein each cantilevered beam includes a proximal end and a distal end;

wherein each cantilevered beam is fixedly connected to the resilient common backbone at the proximal end of each beam; and wherein each cantilevered beam includes a first proof mass connected to one side of a pair of sides of the cantilevered beam adjacent to the distal end, and a second proof mass connected of the other of the pair of sides opposite the first proof mass.

3. The energy harvesting apparatus as defined in claim 1, wherein each cantilevered beam includes a first end portion, a second end portion, and a medial portion extending therebetween;

wherein each cantilevered beam is connected to the resilient common backbone at a location along the medial portion of the cantilevered beam;

wherein the first and the second end portions extend away from the common backbone to thereby define a pair of non-fixed end portions of the cantilevered beam; and wherein a proof mass is connected to the at least one of the pair of non-fixed end portions of the cantilevered beam.

4. The energy harvesting apparatus as defined in claim 1, wherein the composition of the resilient backbone is selected from a group consisting of: brass, silicone, and aluminum, to thereby enhance resilience.

5. The energy harvesting apparatus as defined in claim 1, wherein each of the plurality of generators is configured to have a relatively low quality factor and corresponding relatively wide generator bandwidth to provide energy harvesting capability over a substantial portion of the frequency range to thereby enhance harvesting energy from the structure.

6. The energy harvesting apparatus as defined in claim 1, wherein the resilient common backbone forms at least a portion of a generator configured to enhance energy transfer between adjacent energy harvesting generators.

7. The energy harvesting apparatus as defined in claim 1, wherein at least one generator includes a damper positioned to dampen the magnitude of oscillations of the generator to thereby produce a relatively low quality factor and corresponding relatively wide generator bandwidth.

8. The energy harvesting apparatus as defined in claim 7, wherein each cantilevered beam includes an elongated shim interfaced with a piezoelectric material forming a bimorph; and wherein the damper includes at least one of the following: a plurality of projections extending from the shim, a fluid material surrounding the cantilevered beam, a spring connected to the cantilevered beam.

9. The energy harvesting apparatus as defined in claim 1, further comprising:

a resistive means positioned to reduce the magnitude of the oscillations of each of the plurality of generators to thereby produce a relatively low quality factor and corresponding relatively wide generator bandwidth; and wherein the combination of the plurality of cantilevered beams and the resilient common backbone form or are formed within a microelectromechanical system device.

10. The energy harvesting apparatus as defined in claim 1, wherein the resilient common backbone is configured to transfer energy between adjacent energy harvesting generators of the plurality of energy harvesting generators when the energy harvesting apparatus is operationally employed to thereby enhance overall energy harvesting capability of the energy harvesting apparatus.

11. The energy harvesting apparatuses defined in claim 1, wherein the non-fixed medial and distal portions of the resilient common backbone are not substantially fixed in space; and wherein the resilient common backbone is configured to minimize damping of vibrations translated between adjacent energy harvesting generators when the energy harvesting apparatus is operationally employed.

12. The energy harvesting apparatus as defined in claim 1, wherein the energy harvesting apparatus is adapted to operably couple to an energy consuming device requiring a minimum amount of energy to operationally function; and wherein the mode of each of the plurality of energy harvesting generators is preselected so that when the energy harvesting apparatus is operably coupled to the energy consuming device and operationally employed, the energy harvesting apparatus provides the required minimum amount of energy to the energy consuming device responsive to environmental energy emanating from the structure at any one of the environmentally produced vibration frequencies within the frequency range for the structure at an associated minimum energy level.

13. The energy harvesting apparatus as defined in claim 1, wherein the energy harvesting apparatus is adapted to operably couple to an energy consuming device requiring a predefined minimum amount of energy to operationally function;

wherein the plurality of energy harvesting generators are collectively configured to harvest the predefined minimum amount of energy required to provide energy to the energy consuming device responsive to environmental energy emanating from the structure at least one of the plurality of vibration frequencies within the respective generator bandwidth of any one of the plurality of energy harvesting generators at an associated minimum energy level;

wherein the plurality of energy harvesting generators includes at least three energy harvesting generators; and wherein an upper portion of the generator bandwidth of a first one of the plurality of energy harvesting generators overlaps a lower portion of the generator bandwidth of a second one of the plurality of energy harvesting generators and a lower portion of the generator bandwidth of the first one of the plurality of energy harvesting generators overlaps an upper portion of the generator bandwidth of a third one of the plurality of energy harvesting generators to thereby provide energy harvesting capability at the predefined minimum amount of energy over a substantial portion of the frequency range.

14. The energy harvesting apparatus as defined in claim 1, wherein the energy harvesting apparatus is adapted to operably couple to an energy consuming device requiring a predefined minimum amount of energy to operationally function; and wherein the resonant frequency of each of the plurality of energy harvesting generators is preselected to collectively maximize the number of discrete frequencies within the frequency range capable of providing the predefined minimum amount of energy.

15. The energy harvesting apparatus as defined in claim 1, wherein a quality factor of each mode is less than fifty.

16. The energy harvesting apparatus as defined in claim 1, wherein a quality factor of each mode is less than approximately ten.

17. An energy harvesting apparatus configured to be positioned in vibration receiving communication with a structure, the energy harvesting apparatus comprising:

a base beam adapted to connect to a structure carrying a plurality of environmentally produced vibration frequencies distributed over a frequency range, the base beam formed of a resilient material defining a resilient common backbone having a proximal fixed portion adapted to be fixedly connected to the structure, a non-fixed distal portion, and a non-fixed medial portion extending therebetween, the non-fixed medial and distal portions of the resilient common backbone being not substantially fixed in space to thereby form a cantilever; and a plurality of cantilevered beams each connected to a non-fixed portion of the resilient common backbone and defining a corresponding plurality of energy harvesting generators, each energy harvesting generator having a preselected different resonant frequency defining a mode and configured to resonate at each of a plurality of frequencies adjacent the respective preselected resonant frequency defining a generator bandwidth, the plurality of generators collectively configured to provide energy harvesting over each of the plurality of generator bandwidths to thereby enhance energy harvesting.

18. An energy harvesting apparatus configured to be positioned in vibration receiving communication with a structure, the energy harvesting apparatus comprising:

a housing adapted to connect to a structure carrying a plurality of environmentally produced vibration frequencies distributed over a frequency range;

a base beam formed of a material defining a common backbone, the common backbone connected to the housing; and a plurality of cantilevered beams each separately connected to the common backbone and defining a corresponding plurality of energy harvesting generators, each energy harvesting generator having a preselected different resonant frequency to define a mode and configured to resonate at each of a plurality of frequencies adjacent the respective preselected resonant frequency when operationally employed to generate a predefined minimum amount of energy required by an energy consuming device responsive to environmental energy emanating from the structure at least one of the plurality of adjacent frequencies at an associated minimum energy level to define a generator bandwidth, an upper portion of the generator bandwidth of a first one of the plurality of energy harvesting generators overlapping a lower portion of the generator bandwidth of a second one of the plurality of energy harvesting generators and a lower portion of the generator bandwidth of the first one of the plurality of energy harvesting generators overlapping an upper portion of the generator bandwidth of a third one of the plurality of energy harvesting generators to thereby provide energy harvesting capability at the predefined minimum amount of energy over a substantial portion of the frequency range.

* * * * *

UNITED STATES PATENT AND TRADEMARK OFFICE
CERTIFICATE OF CORRECTION

| | | |
|---|---|---|
| PATENT NO. | : 7,667,375 B2 | Page 1 of 1 |
| APPLICATION NO. | : 11/398840 | |
| DATED | : February 23, 2010 | |
| INVENTOR(S) | : Berkcan et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 871 days.

Signed and Sealed this

Twenty-eighth Day of December, 2010

David J. Kappos
*Director of the United States Patent and Trademark Office*